United States Patent [19]
Kiribayashi

[11] Patent Number: 5,241,137
[45] Date of Patent: Aug. 31, 1993

[54] FLEXIBLE CIRCUIT BOARD WITH AN ELECTRICALLY INSULATING ADHESIVE LAYER

[75] Inventor: Shoji Kiribayashi, Nara, Japan

[73] Assignee: Sharp Kabushiki Kaisha, Osaka, Japan

[21] Appl. No.: 543,876

[22] Filed: Jun. 27, 1990

[30] Foreign Application Priority Data

Jun. 30, 1989 [JP] Japan ................................ 1-170482

[51] Int. Cl.$^5$ ............................................. H05K 1/00
[52] U.S. Cl. .................................. 174/255; 179/88 R; 156/901
[58] Field of Search ............... 174/255, 256, 257, 258, 174/259, 262, 264, 88 R; 156/60, 901, 540, 182; 350/334

[56] References Cited

U.S. PATENT DOCUMENTS

| 3,276,106 | 10/1966 | Bester et al. | 174/262 X |
| 3,483,058 | 12/1969 | Benz | 174/250 X |
| 3,483,059 | 12/1969 | Benz | 174/250 X |
| 3,612,745 | 10/1971 | Warren | 174/256 |
| 3,617,613 | 11/1971 | Benzinger | 174/250 |
| 4,087,300 | 5/1978 | Adler | 156/184 |
| 4,353,954 | 10/1982 | Yamaoka et al. | 174/254 |
| 4,424,095 | 1/1984 | Frisch et al. | 428/901 X |
| 4,479,991 | 10/1984 | Thompson . | |
| 4,496,794 | 1/1985 | Darm et al. | 174/254 |
| 4,503,285 | 5/1985 | Darms et al. | 174/254 |
| 4,832,455 | 5/1989 | Takeno et al. | 350/334 |
| 4,868,637 | 9/1989 | Clements et al. | 174/88 R X |
| 4,897,301 | 1/1990 | Uno et al. | 156/901 |
| 4,900,878 | 2/1990 | Ichkhan | 174/259 |
| 4,937,133 | 6/1990 | Watanabe et al. | 174/254 |

FOREIGN PATENT DOCUMENTS 63-171913 11/1988 Japan .

Primary Examiner—Leo P. Picard
Assistant Examiner—Trinidad Korka
Attorney, Agent, or Firm—Nixon & Vanderhye

[57] ABSTRACT

Disclosed is a flexible circuit board comprising a pair of conductive films and an insulating adhesive layer sandwiched therebetween. The adhesive layer contains conductive powder in such a concentration that no leakage current occurs between the films. For the production of the flexible circuit board, the adhesive layer is first formed on at least one of the conductive layers and then the conductive layers are bonded with the adhesive layer therebetween. For the formation of a through hole portion in the board, pressure is applied at a predetermined spot on the board throughout the thickness thereof, to form recesses on both sides thereof, thereby compressing the corresponding portion of the adhesive layer. This increases the concentration of the conductive powder contained therein, which causes the adhesive layer between the recesses to be conductive and serve as a through hole portion for electrically connecting the two conductive films.

4 Claims, 2 Drawing Sheets

# FLEXIBLE CIRCUIT BOARD WITH AN ELECTRICALLY INSULATING ADHESIVE LAYER

BACKGROUND OF THE INVENTION

1. Field of the Invention

The present invention relates to a flexible circuit board with a simplified structure, and also relates to a method of producing a flexible circuit board having a through hole portion therein.

2. Description of the Prior Art

FIG. 5 shows a conventional flexible circuit board A, which has a five-layered structure including an electrically insulating film substrate 1, a pair of adhesive layers 2a and 2b attached to the upper and lower sides of the insulating film substrate 1, respectively, and a pair of conductive films 3a and 3b respectively fixed to the upper adhesive layer 2a and the lower adhesive layer 2b.

FIG. 6 shows the process of producing the flexible circuit board A. The process comprises two lamination steps. In the first lamination step, the conductive film 3a, on one side of which the adhesive layer 2a has been previously formed, is continuously laid on the upper side of the film substrate 1, and then the conductive film 3a and the substrate 1 are stuck together by the application of heat and pressure using a pair of heat-pressure rollers 4a and 4b. In the second lamination step, the conductive film 3b, on one side of which the adhesive layer 2b has been previously formed, is continuously placed on the lower side of the film substrate 1, and then they are stuck together by means of a pair of heat-pressure rollers 5a and 5b. The adhesive layers may be applied to the film substrate 1 instead of the conductive films 3a and 3b. After the conductive films 3a and 3b and the film substrate 1 are fixed together by the application of heat and pressure, the thus laminated layers are cooled and the adhesive layers therein are dried, resulting in a flexible circuit board A.

The flexible circuit board A thus obtained is then subjected to an etching process so that desired circuits are formed on both sides thereof. Thereafter, a through hole portion is formed therein, resulting in a complete flexible circuit board. The "through hole portion" is an electrical conductive path which electrically connects the upper and lower conductive films of a flexible circuit board.

FIGS. 7 and 8 show conventional through hole portions formed in the flexible circuit board A. Referring to FIG. 7, a hole 7 is first formed in the flexible circuit board A, and the inside wall and the upper and lower rims of the hole 7 are entirely coated with a metal layer 8, resulting in a through hole portion 6a. Referring to FIG. 8, the hole 7 previously formed in the flexible circuit board A is filled with a conductive ink 9, resulting in a through hole portion 6b. Since the metal layer 8 and the conductive ink 9 are conductive, the through hole portions 6a and 6b electrically connects the conductive films 3a and 6b electrically connects the conductive films 3a and 3b.

In a flexible circuit board of the above-mentioned type, since the adhesive layers 2a and 2b are placed between the conductive film 3a and the film substrate 1 and between the conductive film 3b and the film substrate 1, respectively, the adhesive used for the adhesive layers 2a and 2b must have excellent adhesion to both the film substrate 1 and the conductive films 3a and 3b. Thus, the kinds of adhesives which can be used for the adhesive layers 2a and 2b are limited.

Furthermore, the thermal expansion or heat shrinkage of the film substrate 1 is different from that of the conductive films 3a and 3b. Thus, the flexible circuit board tends to be deformed while being cooled and dried after the film substrate 1 and the conductive films 3a and 3b have been bonded together by the application of heat and pressure.

The process of producing such a conventional flexible circuit board requires two separate lamination steps as described above, which complicates the production process.

Furthermore, for the formation of a through hole portion, the step of providing the plating layer or the conductive ink is additionally required after the hole is formed in the flexible circuit board. The increase in the number of steps causes a high production cost.

SUMMARY OF THE INVENTION

The flexible circuit board of this invention, which overcomes the above-discussed and numerous other disadvantages and deficiencies of the prior art, comprises: a pair of conductive films; and an electrically insulating adhesive layer sandwiched between said pair of conductive films.

In a preferred embodiment, the insulating adhesive layer contains conductive powder uniformly dispersed therethrough, the concentration of which is set at such level that no leakage current occurs.

In a preferred embodiment, the thickness of the adhesive layer is approximately 20 to 50 μm.

A method of producing a flexible circuit board in accordance with the present invention comprises the steps of: preparing a pair of conductive films; forming an electrically insulating adhesive layer on one side of at least one of said conductive films, said adhesive layer containing conductive powder uniformly dispersed therethrough in such a concentration that no leakage current occurs, bonding said conductive films with said adhesive layer therebetween, thereby constituting a board; and applying pressure at a predetermined spot on said board throughout the thickness thereof, so as to form recesses at said spot on both sides of said board, thereby obtaining a through hole portion between said recesses.

Thus, the invention described herein makes possible the objectives of (1) providing a flexible circuit board in which an adhesive to be used for the adhesive layer can be selected from a wide variety of adhesives; (2) providing a flexible circuit board which is not deformed while being dried after the conductive films have been bonded together; (3) providing a flexible circuit board which can be produced by a simple process and thus can readily be mass-produced; and (4) providing a method of producing a flexible circuit board, in which a through hole portion for electrically connecting the pair of conductive films can be easily formed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
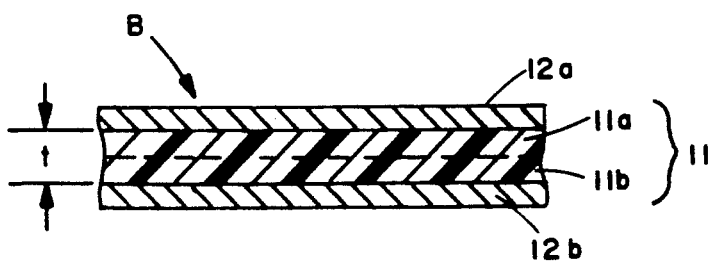
FIG. 1 is a sectional diagram of a flexible circuit board of the invention.

FIG. 1 shows a flexible circuit board B of this invention, which comprises a pair of conductive films 12a and 12b and an adhesive layer 11 sandwiched therebetween. In the flexible circuit board B, the adhesive layer 11 serves as an adhesive for bonding the conductive films 12a and 12b and also as a substrate for electrically insulating one conductive film from the other while supporting the whole flexible circuit board to keep it in an appropriate shape. Thus, the flexible circuit board B requires no film substrate which is usually included in the convention flexible circuit board.

The adhesive layer 11, which serves as the substrate for the whole board B as described above, preferably has a thickness t of about 20 to 50 μm. When the thickness t is smaller than 20 μm, the mechanical strength of the flexible circuit board B is lowered and the insulating property of the adhesive layer 11 becomes insufficient. Conversely, when the thickness t is larger than 50 μm, the flexibility of the circuit board B deteriorates.

A wide variety of adhesives can be used for the adhesive layer 11 as long as they have excellent adhesion to the conductive films 12a and 12b. For example, an adhesive made of resin such as urethane resin, epoxy resin, etc., can be used. As previously described, the kinds of adhesives which can be used for the conventional flexible circuit boards are limited because they should have sufficient adhesion to both the film substrate and the conductive films. On the other hand, in the flexible circuit board B, which does not include a film substrate as described above, the adhesive layer 11 is only required to have sufficient adhesion to the conductive films, so that a wider variety of adhesives can be used for the adhesive layers 11.

The conductive films 12a and 12b can be made of the same material as that of the conventional conductive films. For example, aluminum foil, copper foil, or foil of other metals are advantageously used.

Figure 2:
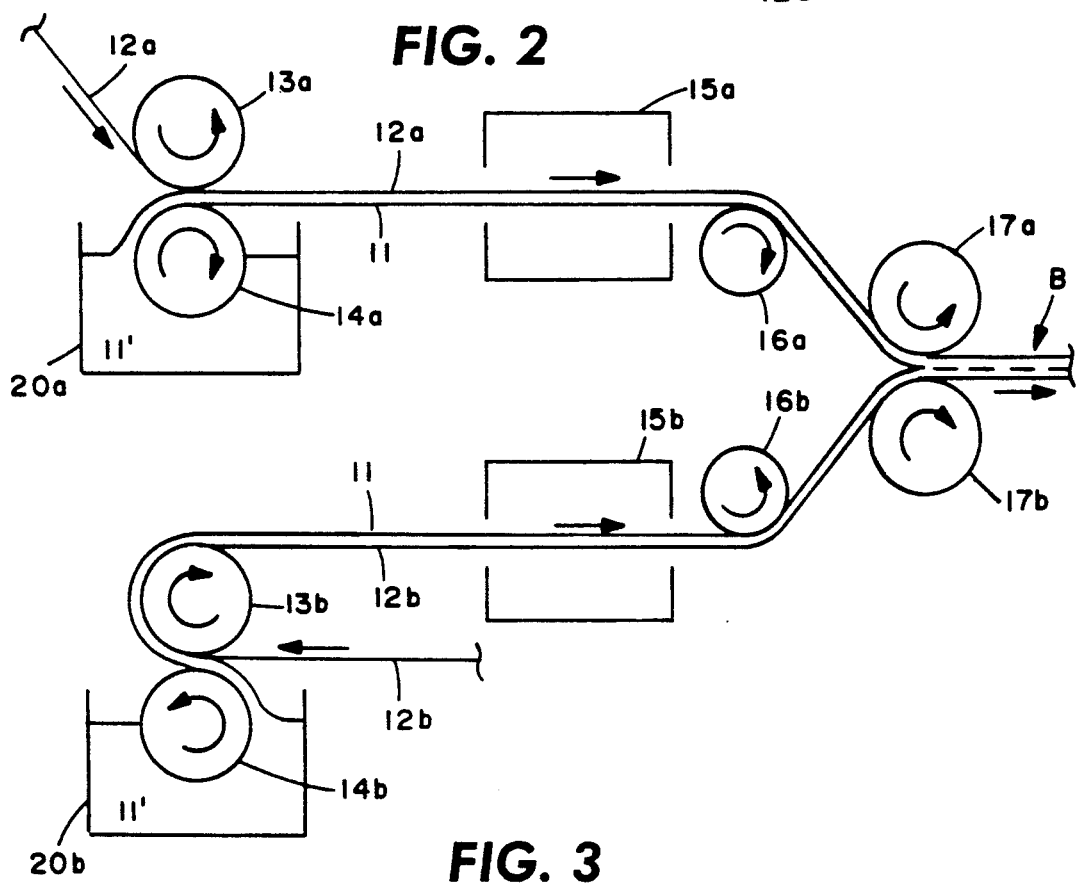
FIG. 2 is a schematic diagram showing a process of producing the flexible circuit board of FIG. 1 according to a method of the invention.

A process of producing the flexible circuit board B will be described below, with reference to FIG. 2.

First, the conductive film 12a is continuously transported through a pair of rollers; one is a guide roller 13a and the other is a coating roller 14a. Below the coating roller 14a is disposed a container 20a containing an adhesive 11' which is one of the above-mentioned wide variety of adhesives. While the conductive film 12a is conveyed along the guide roller 13a, the adhesive 11' is applied to the lower surface thereof by the rotation of the coating roller 14a, thereby forming an adhesive layer 11a having half of the thickness t. While the adhesive layer 11a is being formed on the lower side of the conductive film 12a, another adhesive layer 11b is formed on the upper side of the other conductive film 12b in the same manner. This is, also in this coating operation, while the conductive film 12b is continuously transported along a guide roller 13b, the adhesive 11' contained in a container 20b is applied to the upper side of the conductive layer 12b by a coating roller 14b. The thickness of the thus formed adhesive layer 11b is also half of the thickness t.

The conductive films 12a and 12b having the respective adhesive layers 11a and 11b thereon are then transported through sub-driers 15a and 15b, respectively, for preliminary drying of the adhesive layers 11a and 11b, and then conveyed along guide rollers 16a and 16b, respectively, to be delivered together through a pair of heat-pressure rollers 17a and 17b. At this time, the two conductive films 12a and 12b having the adhesive layers 11a and 11b sandwiched therebetween are pressed and heated by the heat-pressure rollers 17a and 17b, so that they firmly adhere to each other, resulting in a flexible circuit board B.

Thereafter, the thus obtained flexible circuit board B is sent to a main drier (not shown) where the adhesive layer 11 consisting of the adhesive layers 11a and 11b is completely dried. During this drying step, the size and shape of the flexible circuit board B are appropriately retained because it has no film substrate which is usually used in the conventional circuit board and is different in thermal expansion or heat shrinkage from the conductive films 12a and 12b.

As described above, the process of producing the flexible circuit board B requires only a single lamination step, in which the two conductive films 12a and 12b with the respective adhesive layers 11a and 11b thereon are stuck together. This simplifies the production process.

When the thickness t of the adhesive layer 11 of the flexible circuit board B is to be set between about 20 to 30 μm, the adhesive layer need not be formed on both the conductive films 12a and 12b, but can be formed only on the conductive film 12a. In this case, the adhesive layer 11a formed on the conductive film 12a should have the full thickness t, and the devices for forming the adhesive layer 11b on the lower conductive film 12b, i.e., the coating roller 14b, the sub-drier 15b, and the like, are not necessary.

The preliminary drying of the adhesive layers 11a and 11b may dispense with the sub-driers 15a and 15b. In this case, they are dried to some degree in the ambient air while being transported toward the heat-pressure rollers 17a and 17b.

The step of applying the adhesive 11' to the conductive films 12a and 12b may be separated from the step of bonding the conductive films 12a and 12b together. In this case, the adhesive layers 11a and 11b are previously formed on the conductive films 12a and 12b, respectively, and thereafter, the conductive films 12a and 12b with the respective adhesive layers 11a and 11b thereon are fixed together in a separate production line.

Figure 3:
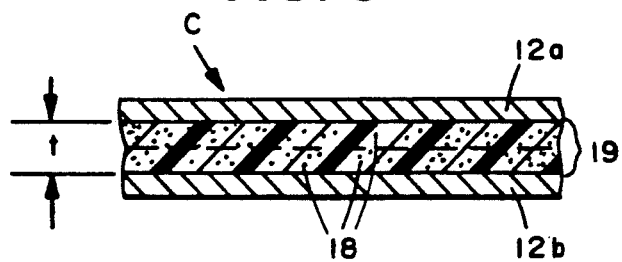
FIG. 3 is a sectional diagram of another flexible circuit board of the invention.

FIG. 3 shows another flexible circuit board C of this invention. The construction of the flexible circuit board C is the same as that of the flexible circuit board B, except that an adhesive layer 19 sandwiched between the conductive films 12a and 12b contains conductive powder 18 uniformly dispersed therethrough. The concentration of the conductive powder 18 in the adhesive layer 19 is set at such a level that the insulating property of the adhesive layer is retained, i.e., no leakage current occurs between the conductive films 12a and 12b. In the same way as in the flexible circuit board B, the adhesive layer 19 of the flexible circuit board C serves as an adhesive and also as a substrate for electrically insulating one conductive film from the other while supporting the whole flexible circuit board to keep it in an appropriate shape.

As the material for the conductive powder 18, conductive powders such as carbon powder, nickel powder, silver powder, or the like, can be used. When the concentration of the conductive powder 18 in the adhesive layer 19 is excessively high, the insulation of the adhesive layer 19 deteriorates. When it is too low, a through hole portion to be formed as described below does not become conductive to provide continuity between the two conductive films 12a and 12b. Thus, the concentration should be set at an appropriate level. The appropriate range of the concentration depends on the material to be used for the conductive powder 18. In general, it is preferably that the volume ratio of the conductive powder 18 to the adhesive layer 19 is 1 to 2% and that the particle size of the conductive powder 18 is 5 to 30 $\mu$m.

As described above, the other arrangements and conditions of the flexible circuit board C, such as the material for the conductive films 12a and 12b, the thickness t of the adhesive layer 19, the material for the adhesive layer 19, and the like, are the same as those of the above-mentioned flexible circuit board B.

The process of producing the flexible circuit board C is also the same as the production process for the flexible circuit board B, except that the adhesive used for the adhesive layer 19 includes the above-mentioned conductive powder 18 uniformly dispersed therethrough.

Figure 4:
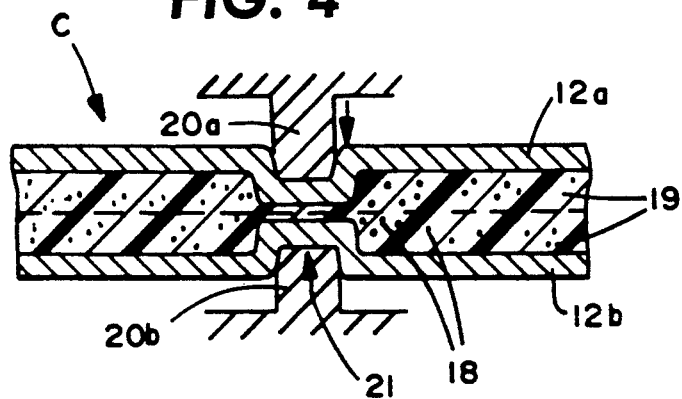
FIG. 4 is a schematic sectional diagram showing a process of forming a through hole portion in accordance with the method of the invention.
Figure 5:
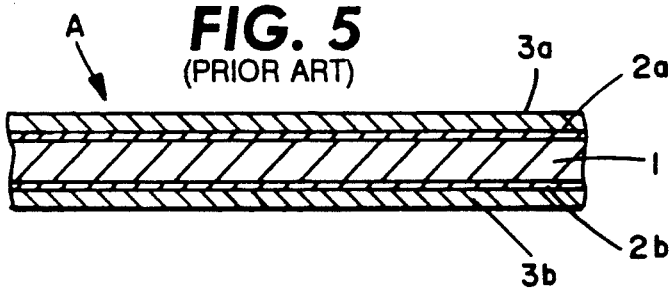
FIG. 5 is a sectional diagram of a conventional flexible circuit board.
Figure 6:
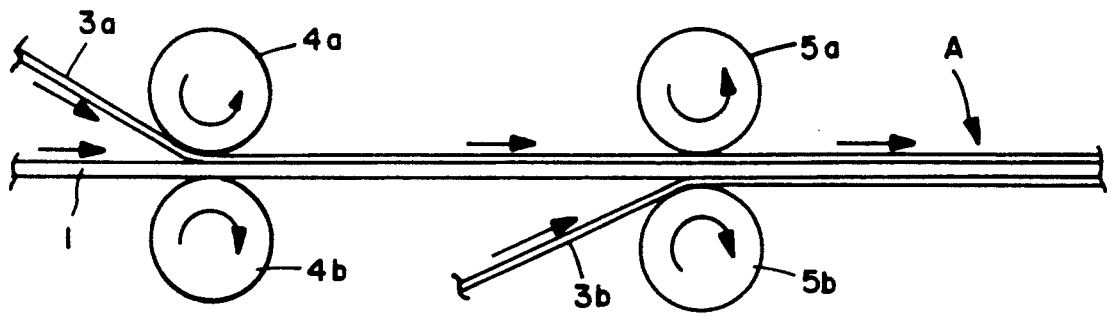
FIG. 6 is a schematic diagram showing the process of producing the flexible circuit board of FIG. 5.
Figure 7:
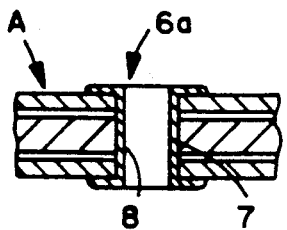
FIG. 7 is a sectional diagram showing a through hole portion formed in the flexible circuit board of FIG. 5.
Figure 8:
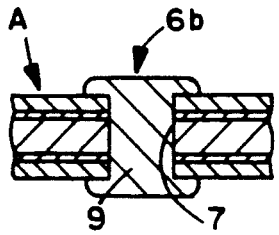
FIG. 8 is a sectional diagram showing another through hole portion formed in the flexible circuit board of FIG. 5.

FIG. 4 shows a process of forming a through hole portion (or electrical conductive path) which electrically connects the conductive films 12a and 12b in the flexible circuit board C, in accordance with the method of this invention.

First, the flexible circuit board C is placed in a heat-press machine, where a predetermined spot of the board C is located between a pressing pin 20a and a support pin 20b. The pressing pin 20a presses the flexible circuit board C downward so that pressure is applied at the spot throughout the thickness of the board C while heat is being applied thereto. As a result, a recess is formed on each of the conductive films 12a and 12b. In the compressed portion thus obtained at the spot, the distance between the upper conductive film 12a and the lower conductive film 12b is reduced, and accordingly, the corresponding portion of the adhesive layer 19 is compressed, so that the concentration of the conductive powder 18 dispersed therethrough becomes high. This causes the adhesive layer 19 in the compressed portion to be conductive, and thus electrically connects the upper and lower conductive films 12a and 12b. This means that the compressed portion of the board C functions as a through hole portion 21. On the other hand, in the portion of the flexible circuit board C where no recess is formed, the insulation between the conductive films 12a and 12b is retained because the concentration of the conductive powder 18 in the adhesive layer 19 is unchanged.

In this way, according to the invention, a through hole portion can be formed simply by forming recesses on both sides of the flexible circuit board C, instead of forming a hole therein. Thus, an additional process after the formation of the hole, such as coating the inside of the hole with metal or filling the hole with conductive ink, is not necessary.

The pressure applied by the heat-press machine is set at the highest level on condition that the conductive films 12a and 12b will not break. It is preferable that the thickness of the resultant through hole portion 21 be 5 $\mu$m or less. The temperature at which the predetermined spot of the board C is heated while being pressed is appropriately set based on the softening and melting points of the adhesive layer 19.

As described above, the flexible circuit board of the invention requires no substrate film which is necessary for the conventional flexible circuit board, because the adhesive layer sandwiched between the two conductive films serves not only as an adhesive but also as a substrate for the whole flexible circuit board. This allows the flexible circuit board to be constructed of only three layers; i.e., the two conductive films and the single adhesive layer. Thus, the adhesive is only required to have adhesion to the conductive layers, so that it can be selected from a wide variety of adhesives. Since there is no substrate film having thermal expansion or heat shrinkage different from that of the conductive layers, the flexible circuit board is not deformed while being dried in the last step of the production. The three-layered structure also simplifies the production process because it requires only a single lamination step, thereby achieving reduced production costs.

According to the invention, the adhesive layer of the flexible circuit board may contain conductive powder, so that a through hole portion can be formed therein simply by applying pressure thereto at a desired spot. This reduces the number of production steps and machines, as compared with the case where a hole is first formed and then the inside of the hole is plated with metal or the hole is filled with a conductive ink. Thus, in the method of producing a flexible circuit board of this invention, a through hole portion for electrically connecting the upper and lower conductive films can be easily formed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

I claim:

1. A flexible circuit board comprising:
   a pair of conductive films to each of which a conductive circuit is provided; and
   an electrically insulating adhesive layer constituting a substrate and bonding said pair of conductive films directly to each other, wherein said insulating adhesive layer contains conductive powder uniformly dispersed therethrough, the concentration of which is set at such a level that no leakage current occurs between said pair of conductive films.

2. A flexible circuit board comprising:
   a pair of conductive films to each of which a conductive circuit is provided; and an electrically insulating adhesive layer constituting a substrate and bonding said pair of conductive films directly to each other, wherein the thickness of said adhesive layer is approximately 20 to 50 μm.

3. A method of producing a flexible circuit board, comprising the steps of:

preparing a pair of conductive films;

forming an electrically insulating adhesive layer on one side of at least one of said conductive films, said adhesive layer containing conductive powder uniformly dispersed therethrough in such a concentration that no leakage current occurs between said pair of conductive films;

bonding said conductive films directly to each other with said adhesive layer therebetween, thereby constituting a substrate; and applying pressure at a predetermined spot on said substrate throughout the thickness thereof, so as to form recesses at said spot on both sides of said substrate, thereby obtaining a through hole portion constituted by a portion of said substrate, the portion being interposed between said recesses and thus being put into an electrically conductive state.

4. A method of producing a flexible circuit board, comprising the steps of:

preparing a pair of conductive films;

forming an electrically insulating adhesive layer on each said conductive film, said adhesive layer containing conductive powder uniformly dispersed therethrough in such a concentration that no leakage current occurs between said pair of conductive films; and bonding said conductive films directly to each other with said adhesive layers therebetween, thereby constituting a substrate.

* * * * *